United States Patent [19]

Kaplan

[11] 4,180,781

[45] Dec. 25, 1979

[54] BIASING AND DRIVE CIRCUITRY FOR QUASI-LINEAR TRANSISTOR AMPLIFIERS

[75] Inventor: Leonard A. Kaplan, Fords, N.J.

[73] Assignee: RCA Corporation, New York, N.Y.

[21] Appl. No.: 912,331

[22] Filed: Jun. 5, 1978

[51] Int. Cl.² ............................................. H03F 3/26
[52] U.S. Cl. ................................... 330/272; 330/255; 330/289
[58] Field of Search ................... 330/207 P, 256, 266, 330/270, 289, 290, 298, 272, 259, 255

[56] References Cited

U.S. PATENT DOCUMENTS

| | | | |
|---|---|---|---|
| 2,951,208 | 8/1960 | Barton | 330/273 |
| 3,967,207 | 6/1976 | Wheatley | 330/207 P X |

OTHER PUBLICATIONS

Smith, Modern Operational Amplifier Design, pp. 2,26, copyright 1971, John Wiley & Sons, Inc., New York, London Sydney, Toronto.
Glogolja, "Biasing Circuit for the Output Stage of a Power Amplifier-The $V_{BE}$ Multiplier," RCA Application Note AN-6297, May 1974.

Primary Examiner—James B. Mullins
Attorney, Agent, or Firm—P. J. Rasmussen; A. L. Limberg; A. J. Jacobson

[57] ABSTRACT

An output transistor in common-emitter amplifier configuration is thermally coupled to means for generating a temperature-compensated component of bias potential. This bias potential is indirectly applied to the base electrode of the output transistor to provide for temperature-stabilized idling current flow in its collector-to-emitter path. More particularly, the bias potential is applied to the non-inverting terminal of a high-gain differential-input amplifier having its output terminal direct coupled to the base of the transistor and direct coupled to its inverting input terminal for regulating the quiescent potential at its output terminal to equal the bias potential. The differential-input amplifier has an input signal applied to one of its input terminals. In response to signal excursions in one sense, the differential-input amplifier drives the output transistor into increased conduction. Arrangements of two output transistors and respective differential-input amplifiers for push-pull operation are described.

7 Claims, 1 Drawing Figure

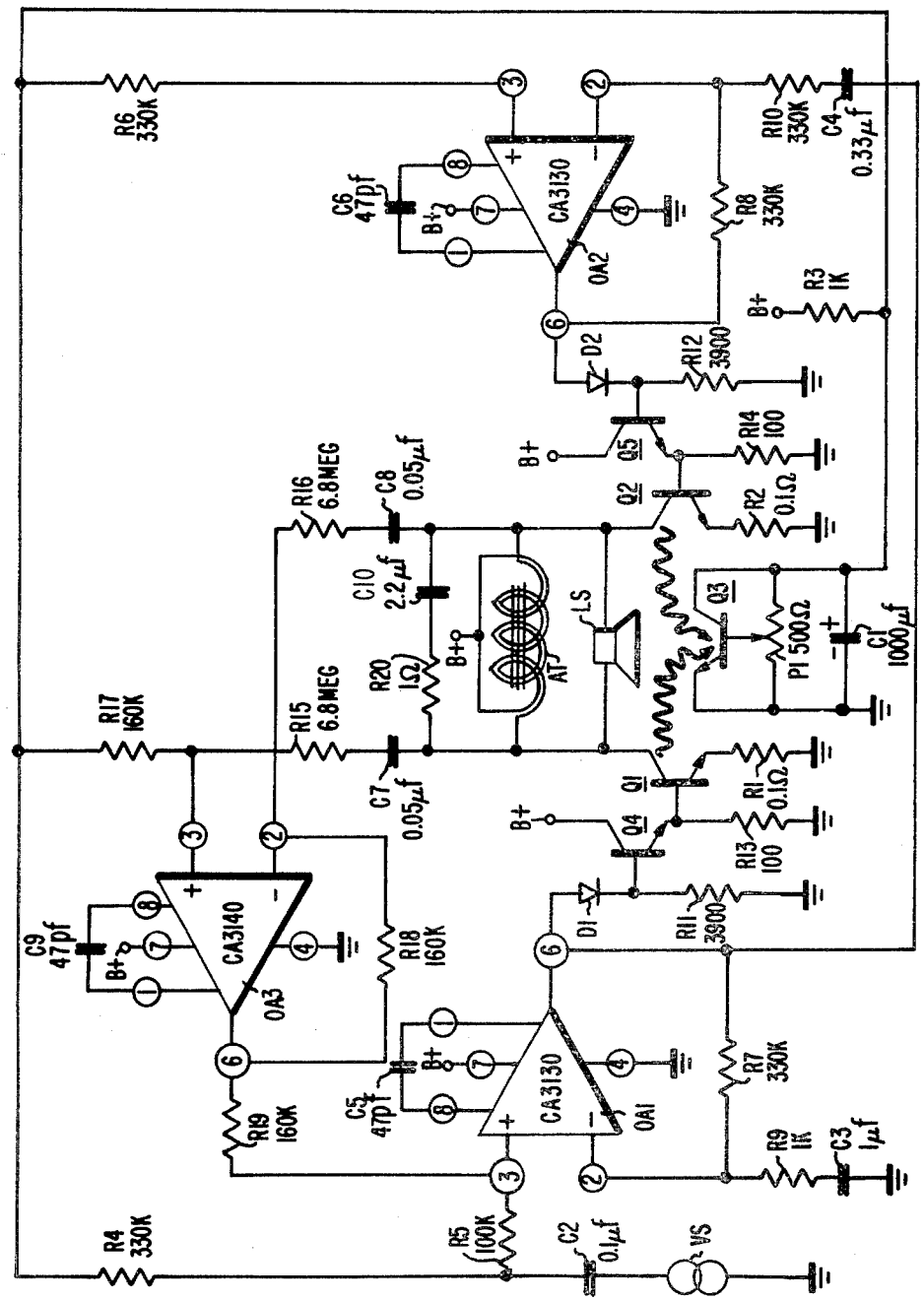

BIASING AND DRIVE CIRCUITRY FOR QUASI-LINEAR TRANSISTOR AMPLIFIERS

The present invention relates to bias and drive circuitry for Class B or AB amplifiers.

The desire to achieve higher power levels in audio amplifiers operated from low voltage supplies—e.g. the 12-14 V. afforded by automobile electrical systems—has rekindled interest in amplifiers using a pair of similar conductivity type output transistors connected in respective common-emitter amplifier configurations and operated in push-pull with each other. Classically, the output transistors in such amplifiers have received push-pull drive through the agency of a driver transformer, which has a center-tapped secondary winding. This winding is connected at its ends to separate ones of the base electrodes of the output transistors and is connected at its center-tap to a source of bias potential. The bias potential is temperature-compensated so as to provide for substantially temperature-independent idling current flow through the collector-to-emitter paths of the output transistors. This arrangement is described by L. E. Barton in his U.S. Pat. No. 2,951,208 entitled "Temperature Controlled Semi-Conductor Bias Circuit" issued Aug. 30, 1960.

It is often desirable, however, to replace the driver transformer to save weight, to eliminate the problem of electro-magnetic fields coupling to the driver transformer, to reduce the size of the amplifier, and to eliminate the complex phase-shift characteristics of the transformer which cause excess phase problems when attempting to linearize the amplifier using overall feedback.

The present invention relates to bias and drive circuitry for Class B or AB amplifiers in which temperature-compensated bias potential is applied to the base electrode of each output transistor in common-emitter amplifier configuration, through the agency of a high-gain differential-input amplifier such as an operational amplifier (or "op amp"), which differential amplifier additionally is used for signal voltage amplification.

The sole FIGURE of the drawing is a schematic diagram of a Class AB amplifier in which the present invention is embodied.

In the sole FIGURE NPN transistors Q1 and Q2 are arranged as common-emitter amplifiers for supplying output signals in Class AB push-pull to a load means shown as loadspeaker LS connected between their collectors. Their collectors are connected to respective separate ends of the center-tapped winding of an auto-transformer. The halves of this winding are tightly coupled together, which can be achieved by winding the halves in bifilar over the same laminated iron core. The center-tap of the auto-transformer winding is connected to a relatively positive operating potential, B+, typically +12 volts, for supplying a like-valued quiescent collector potential to each of the transistors Q1 and Q2. This arrangement is described in detail in my concurrently filed U.S. Pat. application Ser. No. 912,394 filed June 5, 1978 entitled "PHANTOM FULL-BRIDGE AMPLIFIER" and assigned to RCA Corporation.

The emitters of Q1 and Q2 are connected to a reference voltage ground by emitter degeneration resistors R1 and R2, respectively, which are of sufficiently low resistance that it is necessary to supply temperature-dependent quiescent base potentials to Q1 and Q2 to avoid thermal runaway adversely affecting their Class AB operation. An original supply of temperature-dependent potentials is built around an NPN transistor Q3 with which Q1 and Q2 (as indicated by the wavy arrows) are closely thermally coupled—e.g. by sharing a common heat sink—and further includes resistor R3, potentiometer P1, and capacitor C1. R3 connects the collector of Q3 to B+, and Q3 is provided direct-coupled collector-to-base feedback by the resistive potential divider action of P1. P1 has its body connected between the collector and emitter of Q3, and its tap connected to the base of Q3. As well known, this feedback connection maintains the quiescent collector potential $V_{CQ3}$ of Q3 at a value which is equal to its emitter-to-base potential $V_{BEQ3}$ times the factor by which the resistive potential divider formed by potentiometer P1 divides potential. A capacitor C-1 by-passes the collector of Q3 to ground, preventing intercoupling of signal variations between the circuits biased by $V_{CQ3}$.

$V_{CQ3}$ is not applied to the bases of Q1 and Q2 directly, but rather via high-gain differential-input amplifiers—that is, operational amplifiers or "op amps". $V_{CQ3}$ is applied to the non-inverting input terminals (pins 3) of operational amplifiers OA1 and OA2 via the series connection of resistors R4 and R5 and via resistors R6, respectively. Resistor R7 and R8 provide d-c feedback connection between the output terminals (pins 6) and inverting input terminals (pins 2) of op amp OA1 and of op amp OA2, respectively. These feedback connections do not have means for dividing direct potential associated with them, so they operate to maintain the quiescent direct potentials at pins 6 of op amps OA1 and OA2 equal, practically speaking, to $V_{CQ3}$. The quiescent potential at pins 6 of op amp OA1 is translated two junction offset potentials towards ground by the potential offsetting action of forward-biased diode D1 and by the emitter follower action of common-collector amplifier transistor Q4, then applied to the base of Q1. The quiescent potential at pin 6 of op amp OA2 is translated two junction offset potentials towards ground by the potential-offsetting action of forward biased diode D2 and by the emitter-follower action of common-collector amplifier transistor Q5, then applied to the base of Q2. The temperature-dependency of $V_{CQ3}$ compensates for the temperature-dependency of the offset potentials across D1 and the base-emitter junction of Q4 as well as the offset potential $V_{BEQ1}$ across the base-emitter junction of Q1 and, by the same token, for the temperature dependency of the offset potentials across D2 and the base-emitter junction of Q5 as well as the offset potential $V_{BEQ2}$ across the base-emitter junction of Q2. In the amplifier shown in the drawing P1 is adjusted so that $V_{CQ3}$ will have a value substantially three times its emitter-to-base offset potential $V_{BEQ3}$.

A distinctive feature then of the amplifier shown in the drawing is that the temperature dependent potential for application to the bases of the output transistors is applied via the agency of op amps, having respective d-c feedback connections between their output and inverting input terminals for relating their output voltages to the temperature-dependent potential applied to their non-inverting input terminals. This contrasts with the prior art practice of using the center-tapped secondary winding of a driver transformer for this purpose. Having replaced the driver transformer by the op amps OA1 and OA2, insofar as concerns biasing of the output transistors Q1 and Q2, one is faced with the problem of supplanting the driver transformer insofar as concerns its functioning to apply antiphase drive signals, respectively, to the base of Q1 and to the base of Q2. In considering this problem, connection to the non-inverting input terminal (pin 3) of op amp OA1, other than through resistor R5, will be assumed not to exist.

Input signal voltage is supplied from a voltage source VS coupled to the non-inverting input terminal (pin 3) of op amp OA1 via a path through coupling capacitor C2 and resistor R5. This would cause greatly amplified signal voltage at the output terminal (pin 6) of op amp OA1 if it were operated open-loop. However, a degenerative feedback connection for signal variations is provided by the potential divider action between resistor R7 and the series combination of resistor R9 and capacitor C3. C3 is of relatively low impedance compared to R9 down to the lower signal frequencies of interest in the amplifier. The voltage again between the non-inverting-input and output terminals of op amp OA1 is constrained to be substantially equal to $(R_7/R_9)+1$, where $R_7$ and $R_9$ are the respective resistances of resistors R7 and R9, it being well known that the voltage gain of an op amp between its non-inverting-input and output terminals is essentially equal to the factor by which output signal appearing at its output terminal is divided to provide feedback signal for application to its inverting input terminal. Op amp OA1, then, in addition to providing direct coupling from the collector circuit of Q3 to the anode of diode D1 for applying $V_{CQ3}$ to the anode of diode D1, provides amplified response to the input signal from signal source VS to the anode of diode D1, which response is of the same phase as the input signal.

Op amp OA2 is arranged to function as an inverting amplifier as well as for applying $V_{CQ3}$ to the anode of diode D2. That is, it provides amplified response at its output terminal to the input signal, which response is of the same amplitude as the amplified response op amp OA1 provides at its output terminal, but of opposite phase. To this end, the amplified response at the output terminal (pin 6) of op amp OA1 is applied to the inverting input terminal (pin 2) of op amp OA2 via the series combination of a coupling capacitor C4 and a resistor R10 having a resistance of the same value as that of resistor R8, connecting the output terminal (pin 6) of op amp OA2 to its inverting input terminal (pin 2).

Capacitor C5 connecting pins 1 and 8 of op amp OA1, capacitor C6 connecting pins 1 and 8 of op amp OA2, and capacitor C9 connecting pins 1 and 8 of op amp OA3 are stabilizing capacitors for determining the primary roll-off frequencies of the op amps. Op amps OA1, OA2 and OA3 have their positive supply voltage connections at their pins 7. Their pins 4 are connected to ground, which is in effect a negative supply potential for op amps OA1 and OA2 as compared to their quiescent input potentials at their pins 2 and 3 and their quiescent output potentials at their pins 6. It is to accomodate a sufficiently large quiescent output potential between pins 4 and 6 of each of the op amps OA1 and OA2 to accomodate expected output signal swings without clipping, that diodes D1 and D2 are used in direct coupling the output terminals of op amps OA1 and OA2 to the bases of Q4 and Q5 respectively. Diodes D1 and D2 are maintained in forward bias by connecting their cathodes to ground via resistors R11 and R12, respectively; and the base-emitter junctions of Q4 and Q5 are maintained in forward bias by connecting their respective emitters to ground via resistors R13 and R14, respectively. The forward-biased diodes D1 and D2 translate the signal potentials at the output terminals of op amps OA1 and OA2 towards ground potential without appreciably attenuating them prior to their application to the base electrodes of Q4 and Q5, respectively.

When the input signal from voltage source VS is zero-valued, the setting of potentiometer P1 can be adjusted to provide the $V_{CQ3}$, around $3V_{BEQ3}$ in value, that fixes the desired idling currents through the collector-to-emitter paths of Q1 and Q2 to condition them for Class AB operation. A positive excursion of input signal from voltage source VS causes an amplified positive excursion of signal at the output terminal (pin 6) of op amp OA1, which output terminal is coupled by diode D1 and emitter-follower Q4 to the base electrode of Q1 to increase its conduction above idling current level. The positive excursion of input signal causes an amplified negative excursion of input signal at the output terminal (pin 6) of op amp OA2. This reduces the emitter potential of emitter-follower Q5 so that Q2 has insufficient base potential to maintain conduction even at the relatively small idling current level. The conduction of Q1 pulls the potential at its collector potential and at the first terminal of loudspeaker LS towards ground. This negative-going potential as applied to one end of the center-tapped autotransformer winding AT causes a positive-going potential at the other end which is connected to the second terminal of loudspeaker LS, Q2 being insufficiently conductive to resist the potential at its collector electrode going more positive.

On the other hand, a negative excursion of input signal from voltage source VS causes an amplified negative excursion of signal at the output terminal (pin 6) of op amp OA1. This is coupled through diode D1 and emitter-follower Q4 to the base electrode of Q1 to reduce the base potential of Q1 below the value sufficient to maintain its conduction even at the relatively small idling current level. The negative excursion of input signal causes a positive amplified excursion of signal at the output terminal (pin 6) of op amp OA2, coupled by diode D2 and emitter-follower Q5 to the base electrode of Q2 to increase its conduction above idling current level. The conduction of Q2 pulls the potential at its collector and the second terminal of loudspeaker LS towards ground. This negative-going potential is reversed in phase by autotransformer winding At to raise the potential at the first terminal of loudspeaker LS, Q1 being insufficiently conductive to resist the potential at its collector electrode going more positive.

The autotransformer winding AT could have a secondary winding associated with it to develop a singleended feedback signal to be coupled back to the input terminal (pin 3) of op amp OA1 to complete an overall feedback loop for linearizing the complete amplifier. Such a winding might be wound trifilar with the two halves of the centertapped autotransformer winding AT to obtain close coupling that would keep phase-shift low, to reduce tendencies towards undesired regeneration in the overall feedback loop.

A preferable practice, however, is to use a balanced-to-single-ended signal converter arrangement using transistors to avoid the phase shift problems associated with a double-wound transformer. The signal converter must be of a type able to accept balanced input signal voltage swings over a range twice the B+ operating voltage, owing to the large voltage swings at the ends of the autotransformer winding AT. The particular balanced-to-single-ended signal converter shown comprises op amp OA3; resistors $R_{15}$, $R_{16}$, $R_{17}$, and $R_{18}$; and their inter-connections. The operation of this type of signal converter is described in Chapter V of *Modern Operational Circuit Design* by John I. Smith, published by John Wiley & Sons Inc. (New York)—and in Chapter 6, Section 6.1.1 of *Operational Amplifiers - Design and Applications*, by the staff of Burr, Brown, edited by Graeme, Tobey & Huelsman and published by McGraw Hill Book Co. (New York)—which descriptions are incorporated herein by reference. The voltages at the collector electrodes of Q1 and Q2 are separated from their respective direct components by blocking capacitors $C_7$ and $C_8$, respectively, and applied to the non-inverting and inverting input connections of the balanced-to-single-ended signal converter. Response to the difference of these voltages separated from their respective direct components appears at the outputterminal (pin 6) of op amp OA3.

This response is superimposed on a quiescent potential equal to $V_{CEQ3}$, facilitating the output terminal (pin 6) of op amp OA3 being direct coupled to the non-inverting input terminal (pin 3) of op amp OA1 by a resistor $R_{19}$, without affecting the biasing of OA1 in any substantial degree. The response of OA3 is divided by the potential divider action of resistors R19 and R5 and applied to the non-inverting input terminal (pin 3) of op amp OA1. The reason for the $V_{CEQ3}$ quiescent potential at the output terminal (pin 6) of op amp OA3 is: resistor R18 connects the output terminal (pin 6) of OA3 to its inverting input terminal (pin 2), completing a direct coupled feedback loop stabilizing the quiescent voltages at those terminals to the $V_{CEQ3}$ quiescent potential applied to the non-inverting input terminal (pin 3) from the collector electrode of Q3 via resistor R17.

One may alternatively replace C7 and C8 with direct connections and insert a blocking capacitor in series with R19.

Capacitor C10 and resistor $R_{20}$ are connected across the autotransformer winding AT to provide the dominant high-frequency roll-off in the overall feedback loop, so the loop is unconditionally stable against self-oscillatory tendencies.

Modifications to the amplifier described will, in light of the foregoing disclosure, suggest themselves to one skilled in and familiar with the art of audio amplifier design, and the scope of the ensuring claims should be construed accordingly. E.g., the arrangement of Q3 and the potentiometer P1 to provide direct-coupled collector-to-base feedback for developing a $V_{CEQ3}$ of around three junction offset potentials may be replaced by a string of forward biased diodes, such inter-changeability being known in the art. As a further example, D1 and D2 might be replaced by respective emitter-follower transistors. As still a further example, D1 and D2 may be replaced by diodes reverse-biased to operate in avalanche, the necessary adjustment in the biasing potential $V_{CEQ3}$ being afforded by a further diode arranged for avalanche conduction in the connection of the collector electrode of Q3 to potentiometer P1, the setting of which is then readjusted.

What is claimed is:

1. In an amplifier including a first transistor means with base and emitter and collector electrodes; means connecting said first transistor means for operation in a first common-emitter amplifier configuration including a connection of its emitter electrode to a point of reference potential; and bias potential supply means sensitive to the temperature of said first transistor means for supplying a bias potential, a temperature-compensated component of which if applied via direct coupling to the base of said first transistor means would result in substantially invariant collector idling current despite change in the temperature of said first transistor means, the improvement comprising:

a first high-gain differential-input amplifier having a non-inverting input terminal to which said bias potential is applied, having an inverting input terminal, and having an output terminal;

a first resistance with first and second ends respectively connected to the output terminal of said first differential input amplifier and to its inverting input terminal for maintaining its inverting input terminal at substantially the same quiescent potential as at its non-inverting input terminal and thereby referring the quiescent potential at its output terminal to the bias potential applied to its non-inverting input terminal;

first direct coupling means for direct coupling the output terminal of said first differential-input amplifier to the base electrode of said first transistor means;

means for superimposing an input signal on the quiescent potential at one of the input terminals of said first differential-input amplifier; and a second resistance with a first end connected to the inverting input terminal of said first differential input amplifier and with a second end connected for dividing the signal variations fed back from the output terminal of said first differential-input amplifier to its inverting input terminal via said first resistance, for causing a response to said input signal to be superimposed on the quiescent potential at the output terminal of said first differential-input amplifier, which response is proportionally related to said input signal by a factor dependent on the values of said first and second resistances.

2. An improved amplifier as set forth in claim 1 including a second transistor means of the same conductivity type as said first transistor means, with base and emitter and collector electrodes; means connecting said second transistor in a second common-emitter amplifier configuration including a connection of its emitter electrode to said point of reference potential; and means for operating said second transistor means in push-pull with said first transistor means which includes:

a second high-gain differential-input amplifier having a non-inverting input terminal to which said bias potential is applied, and having an inverting input terminal and an output terminal;

means for connecting said second differential-input amplifier as a minus-unity gain signal potential amplifier, including a third resistance in a connection of the output terminal of the first differential input amplifier to the inverting input terminal of the second differential-input amplifier, and including a fourth resistance of substantially the same value as said third resistance connecting the output terminal of said second differential-input amplifier to its inverting input terminal; and second direct coupling means, similar to said first direct coupling means, for direct coupling the output terminal of said second differential-input amplifier to the base electrode of said second transistor means.

3. An improved amplifier as set forth in claim 2 including:

a third high-gain differential-input amplifier having a non-inverting input terminal, an inverting input terminal, and an output terminal and means connecting said third differential-input amplifier as a balanced-to-single-ended signal converter, which converter has a non-inverting input coupled to the collector electrode of said first transistor means, has an inverting input connection to the collector electrode of said second transistor means, and has an output connection to the non-inverting input terminal of said first differential-input amplifier for applying a feedback signal thereto responsive to the difference between the signal potentials at the collector electrodes of said first and second transistor means, said means connecting said third differential amplifier as a balanced-to-single-ended signal converter further including:

a fifth resistance with a first end at the non-inverting input connection of said converter and with a second end connected to the non-inverting input terminal of said third differential-input amplifier;

a sixth resistance with a first end at the inverting input connection of said converter and with a second end connected to the inverting input terminal of said third differential-input amplifier, a seventh resistance with a first end connected to the non-inverting input terminal of said third differential input amplifier and with a second end to which said bias potential is applied, and an eighth resistance with first and second ends respectively connected to the inverting input terminal of said third differential-input amplifier and to its output terminal.

4. An improved amplifier as set forth in claim 2 or 3 wherein said first and second direct coupling means are of a type which translate the potentials at the output terminals of said first and second differential-input amplifiers closer by a predetermined potential to the potential of said point of reference potential for application to the base electrodes of said first and second transistor means, respectively, and wherein said bias potential supply means includes means for augmenting said temperature-compensated component of potential by said predetermined potential to form said bias potential.

5. An improved amplifier as set forth in claim 4 wherein each of said first and second differential-input amplifiers has supply voltage connections to said point of reference potential and to a point of operating potential of the same polarity with respect to said reference potential as said bias potential, each of said first and second differential-input amplifiers is of a type having the linear range of its output signal limited between said reference and operating potentials, and said first and second direct coupling means translate potentials by a predetermined potential sufficiently large to operate said first and second differential-input amplifiers so their output signals fall within their linear ranges.

6. An improved amplifier as set forth in claim 2 or 3 wherein said first and second direct coupling means are of a type tending to translate the potentials at the output terminals of said first and second differential-input amplifiers toward said reference potential by an amount substantially equal to the sum of the offset potentials across a given number N of forward-biased semiconductor junctions, and wherein said bias potential supply means includes:

a third transistor to which each of said first and second transistors is thermally coupled, said third transistor having base and emitter and collector electrodes;

means for applying an operating current between the emitter and collector electrodes of said third transistor;

a direct-coupled collector-to-base feedback connection for said third transistor for conditioning it to conduct said operating current, which feedback connection includes potential divider means for dividing potential by a factor substantially equal to N+1, said potential divider having an input circuit and an output circuit, the first ends of which input and output circuits are connected in common at the emitter electrode of said third transistor, and the second ends of which input and output circuits are connected so the collector electrode of said third transistor is direct coupled to the second end of the input circuit and so the potential at the second end of the output circuit is applied to the base electrode of said third transistor, whereby a potential substantially (N+1) times the emitter-to-base potential of said third transistor appears between the ends of the input circuit of the potential divider means, one of which is connected to said point of reference potential and the other of which supplies said bias potential.

7. An improved amplifier as set forth in claim 6 wherein each of said first and second direct coupling means includes a respective emitter-follower transistor with an emitter electrode connected to the base electrode of a respective one of said first and second transistor means and with a respective base electrode, and a respective semi-conductor junction connecting the output terminal of a respective one of said first and second differential-input amplifiers to the base electrode of its respective emitter-follower transistor and being poled for forward conduction of the base current of that emitter-follower transistor.

* * * * *

UNITED STATES PATENT AND TRADEMARK OFFICE
CERTIFICATE OF CORRECTION

PATENT NO. : 4180781

DATED : December 25, 1979

INVENTOR(S) : Leonard Abraham Kaplan

It is certified that error appears in the above-identified patent and that said Letters Patent is hereby corrected as shown below:

In column 1, line 41, after "differential" insert --amplifier--.

In column 4, line 45, "At" should be --AT--.

In column 5, lines 16 and 17, "outputter-minal" should be --output terminal--.

Signed and Sealed this

Twenty-seventh Day of May 1980

[SEAL]

Attest:

SIDNEY A. DIAMOND

Attesting Officer  Commissioner of Patents and Trademarks